United States Patent
Kim

[19]

[11] Patent Number: 5,996,041
[45] Date of Patent: Nov. 30, 1999

[54] INTEGRATED CIRCUIT MEMORY DEVICES HAVING PAGE FLAG CELLS WHICH INDICATE THE TRUE OR NON-TRUE STATE OF PAGE DATA THEREIN AND METHODS OF OPERATING THE SAME

[75] Inventor: Jin-Ki Kim, Seoul, Rep. of Korea

[73] Assignee: Samsung Electronics Co., Ltd., Rep. of Korea

[21] Appl. No.: 08/744,437

[22] Filed: Nov. 8, 1996

[30] Foreign Application Priority Data

Nov. 10, 1995 [KR] Rep. of Korea ............ 95-40639

[51] Int. Cl.[6] .............. G06F 12/00; G11C 7/00; G11C 16/06
[52] U.S. Cl. ............ 711/103; 711/100; 711/154; 711/156; 365/185.09; 365/185.23; 365/185.29; 365/190; 365/207; 365/218
[58] Field of Search ................... 711/100, 103, 711/154; 365/156, 185.09, 185.23, 185.29, 185.33, 190, 201, 218

[56] References Cited

U.S. PATENT DOCUMENTS

| | | | |
|---|---|---|---|
| 5,172,339 | 12/1992 | Noguchi et al. | 365/201 |
| 5,293,212 | 3/1994 | Yamamoto et al. | 365/218 |
| 5,299,162 | 3/1994 | Kim et al. | 365/201 |
| 5,347,490 | 9/1994 | Terada | 365/219 |
| 5,465,235 | 11/1995 | Miyamoto | 365/203 |
| 5,625,590 | 4/1997 | Choi et al. | 365/185.17 |
| 5,671,178 | 9/1997 | Park et al. | 365/185.22 |
| 5,677,873 | 10/1997 | Choi et al. | 365/185.17 |
| 5,682,345 | 10/1997 | Roohparvar | 365/185.04 |
| 5,696,717 | 12/1997 | Koh | 365/185.22 |

OTHER PUBLICATIONS

"Error Check And Correction For Soft Error Of Dynamic Random–Access"; Mar. 1989; vol. 31, No. 10; pp. 58–60.
H.S. Anand, "High Performance, Single bit Error Correction" Nov. 1983; vol. 26; pp. 2958–2960.

*Primary Examiner*—Tuan V. Thai
*Attorney, Agent, or Firm*—Myers Bigel Sibley & Sajovec

[57] ABSTRACT

Integrated circuit memory devices with page copy flag cells include an array of memory cells and a plurality of flag cells coupled thereto which retain a flag to indicate whether a respective page of memory cells contains data copied in an inverted format from another page of memory cells. The memory cells and flag cells may comprise EEPROM cells and each page of memory cells preferably shares a word line with a respective flag cell. The flag may constitute a logic 1 (or logic 0) signal stored in the flag EEPROM cell to indicate whether the data in the corresponding page of memory is a true or an inverted copy of a page of data copied from another page at a different address. A page buffer is also provided to retain data read from a page of memory and read from a corresponding flag cell, and an exclusive OR gate for inverting the data outputted by the page buffer if the flag has been set and passing the outputted data unchanged if the flag has not been set.

3 Claims, 9 Drawing Sheets

INTEGRATED CIRCUIT MEMORY DEVICES HAVING PAGE FLAG CELLS WHICH INDICATE THE TRUE OR NON-TRUE STATE OF PAGE DATA THEREIN AND METHODS OF OPERATING THE SAME

FIELD OF THE INVENTION

The present invention relates to integrated circuit memory devices, and more particularly to integrated circuit memory devices having page buffers therein.

BACKGROUND OF THE INVENTION

Semiconductor memory devices for storing data can typically be categorized as either volatile memory devices or nonvolatile memory devices. Volatile memory devices lose their stored data when their power supplies are interrupted, however nonvolatile memory devices retain their stored data even when their power supplies are interrupted. Thus, nonvolatile memory devices are widely used in applications where the possibility of power supply interruption is present.

Conventional nonvolatile memory devices include a type of electrically erasable programmable read only memory (EEPROM) device typically referred to as a flash EEPROM device. Flash EEPROM devices typically include a semiconductor substrate of first conductivity type (e.g., P-type), spaced source and drain regions of second conductivity type (e.g., N-type) in the substrate, a channel region at a face of the substrate, between the spaced source and drain regions, a floating gate for storing charge carriers when the device is programmed and a control gate which overlies the floating gate, opposite the channel region. Conventional flash EEPROM integrated circuit memory devices may contain column-by-column arrays of NAND EEPROM cells having the general construction illustrated in cross-section and schematically by FIGS. 11.58 and 11.59 from a handbook by B. Prince et al. entitled Semiconductor Memories, John Wiley & Sons Ltd., pp. 603–604 (1991); and in an article by M. Momodomi et al. entitled An Experimental 4-Mbit CMOS EEPROM with a NAND Structured Cell, IEEE Journal of Solid State Circuits, Vol. 24, No. 5, p. 1238 October (1989). Typical schematic and cross-sectional layouts of arrays containing NAND EEPROM cells are also more fully described in commonly assigned U.S. Pat. No. 5,546,341 to Suh et al. entitled Nonvolatile Semiconductor Memory.

Operation of a flash EEPROM device is typically divided into three modes including programming, erasing and reading. Programming of a flash EEPROM device is typically achieved by biasing the drain region to a first positive bias, relative to the source region, and biasing the control gate to a second positive bias which is greater than the first positive bias. In the absence of any stored charge on the floating gate, these biases cause the formation of an inversion-layer channel of electrons at the face of the substrate, between the source and drain regions. As will be understood by those skilled in the art, the drain-to-source voltage accelerates these electrons through the channel to the drain region where they acquire sufficiently large kinetic energy and are typically referred to as "hot" electrons. The larger positive bias on the control gate also establishes an electrical field in a tunneling oxide layer which separates the floating gate from the channel region. This electric field attracts the hot electrons and accelerates them toward the floating gate, which is disposed between the control gate and the channel region, by a process known as tunneling. The floating gate then accumulates and traps the accumulated charge. Fortunately, the process of charging the floating gate is self-limiting. The negative charge that accumulates on the floating gate reduces the strength of the electric field in the tunneling oxide layer to the point where it is no longer capable of accelerating "hot" electrons from the drain side of the channel region.

As will be understood by those skilled in the art, the accumulation of a large quantity of trapped charge (electrons) on the floating gate will cause the effective threshold voltage ($V_{th}$) of the field effect transistor comprising the source region, drain region, channel region and control gate to increase. If this increase is sufficiently large, the field effect transistor will remain in a nonconductive "off" state when a predetermined "read" voltage is applied to the control gate during a read operation (i.e., $V_{th} > V_{read}$). In this state, known as the programmed state, the EEPROM device may be said to be storing a logic 0. Once programmed, the EEPROM device retains its higher threshold voltage even when its power supply is interrupted or turned off for long periods of time.

Erasing of the EEPROM device may also be achieved by removing the stored charge from the floating gate. The erasure process can be achieved, for example, by grounding the control gate and applying a positive bias to the substrate (e.g., 10–20 Volts). Accordingly, flash EEPROM devices typically require bulk erasure of large portions of an array of cells since the effects of applying a large substrate bias typically cannot be confined to a single EEPROM cell.

Reading of the EEPROM device is achieved by applying a predetermined read voltage ($V_{read}$) to the control gate, typically via a word line connecting a row (i.e., page) of identical EEPROM devices or "cells", and applying a positive bias to the drain region, typically via a bit line connecting a column of identical EEPROM cells. If the EEPROM device is programmed, it will not conduct drain current ($I_{ds}$) and the bit line will remain at the positive bias. However, if the EEPROM device has not been programmed (or has been erased), it will heavily conduct and pull the bit lie down to ground potential (GND). In this state, the EEPROM device may be said to be storing a logic 1. Thus, by monitoring the bit line current and voltage, the programmed state (i.e., 1 or 0) of the EEPROM device can be determined.

During the performance of a reading operation, it may become necessary to perform a page copy operation by copying data read from a first page of memory cells at a first address to a second page of memory cells at a second different address. As illustrated by FIG. 1, a conventional page copy operation typically includes the steps of reading data from a first page of memory cells 101 in an array 100 to a page buffer 300 and then to a storage device 400 external to the page buffer 300. Next, the data in the storage device 400 is returned to the page buffer 300 and then reprogrammed into the second page of memory cells 102 using conventional programming operations. The operations illustrated by FIG. 1 are more fully described by FIG. 2 which illustrates the timing of signals required to perform a conventional page copy operation. As will be understood by those skilled in the art, the signal CLE represents the command latch enable signal, the signal ALE represents the address latch enable signal, the signal $\overline{WE}$ represents the write enable signal and the signal $\overline{RE}$ represents the read enable signal. Referring now to FIG. 2, after applying a read command "00h" through an input/output (I/O) terminal during interval T1, addresses of three cycles are provided during interval T2 so that the memory device 100 outputs as a batch the data stored in all the memory cells of the first page 101 (designated by the addresses) through the bit lines.

The output data is then sensed and temporarily retained by the page buffer 300 during interval T3. The read enable signal $\overline{\text{RE}}$ is then toggled to commence serial transfer of the retained data from the buffer 300 to the external storage device 400 during interval T4. A data loading command "80h" is then input and addresses of three cycles are applied during interval T5. The data stored in the storage device 400 in then loaded into the page buffer 300 during interval T6. Finally, a page programming command "10h" is inputted during interval T7 so that all memory cells in the second page 102 can be programmed during interval T8. Unfortunately, the page copy operations illustrated by FIG. 1 require external storage 400 and typically require that such external storage be loaded serially from the page buffer 300 and downloaded serially to the page buffer 300, which can very time consuming.

To address the limitations associated with the memory device and page copy operations illustrated by FIG. 1, alternative page copy operations were developed. For example, FIG. 3 illustrates a second conventional method for performing page copy operations. According to this method, a first page 101 of data is read into a page buffer 300 where it is retained in an inverted format. The retained data is then stored back into the memory 100 at an address of a second page 102. However, these page copy operations are limited because the copy of the original data from the first page is not stored as a "true" copy but is stored as an inverted copy. Accordingly, during subsequent read operations, it is possible for data errors to occur if the inverted copy is treated as a true copy.

Thus, notwithstanding the above described memory devices and methods for performing page copy operations, there continues to be a need for improved memory devices and methods for performing page copy operations which do not require external memory, serial loading or downloading operations and are not subject to the risk of data errors when true copies of data are not stored during page copy operations.

SUMMARY OF THE INVENTION

It is therefore an object of the present invention to provide improved integrated circuit memory devices, and methods of operating same.

It is another object of the present invention to provide integrated circuit memory devices which are capable of efficiently performing page copy operations, and methods of operating same.

It is still another object of the present invention to provide integrated circuit memory devices which have reduced susceptibility to errors when reading data stored during page copy operations, and methods of operating same.

These and other objects, features and advantages of the present invention are provided by integrated circuit memory devices which contain an array of memory cells and a plurality of flag cells coupled thereto which retain a flag to indicate whether a respective page of memory cells contains data copied in an inverted format from another page of memory cells. According to a preferred embodiment of the present invention, the memory cells and flag cells comprise EEPROM cells and each page of memory cells shares a word line with a respective flag cell. The flag may constitute a logic 1 (or logic 0) signal stored in the flag EEPROM cell to indicate whether the data in the corresponding page of memory is a true or an inverted copy of a page of data copied from another page at a different address. The preferred embodiment also comprises a page buffer to retain data read from a page of memory and read from a corresponding flag cell, and an exclusive OR gate (or NOR gate) for inverting the data outputted by the page buffer if the flag has been set and passing the outputted data unchanged if the flag has not been set.

Methods are also preferably provided for operating an integrated circuit memory device by reading data from a first page of memory cells into a page buffer which retains the read data in an inverted format and then copying the read data (in inverted format) from the page buffer into a second page of memory cells. In addition to these steps, a step is also performed to set a flag indicating that the data copied from the first page of memory cells into the second page of memory cells was read by the page buffer. The data in the second page of memory can then be transmitted to external the memory device by reading data from the second page of memory cells into the page buffer and then outputting the data from the page buffer and inverting the data if the flag has been set by transmitting the data through an exclusive gate having an input responsive to the value of the flag. Thus, the present invention eliminates the need to temporarily store page data to be copied in an external device and also eliminates the possibility that an error may occur when true copies of data are not stored during page copy operations.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
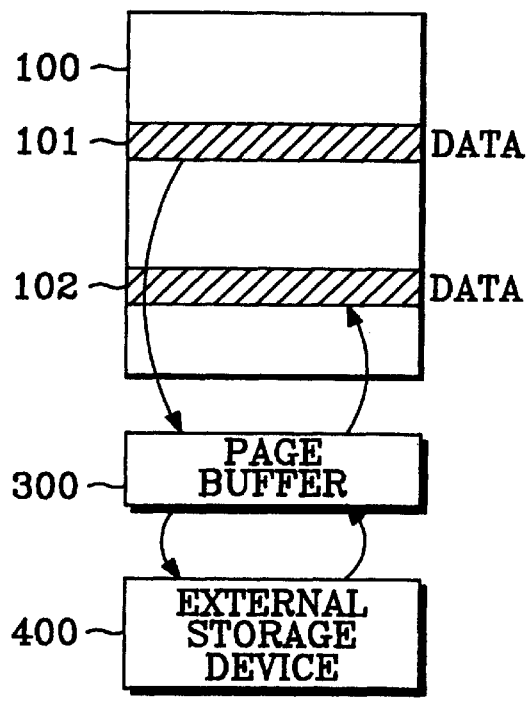
FIG. 1 illustrates operations for copying a page of memory from one address to another, according to a first conventional method.
Figure 3:
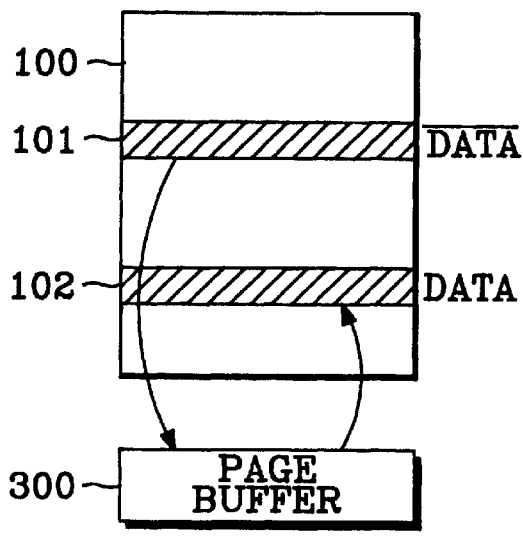
FIG. 3 illustrates operations for copying a page of memory from one address to another, according to a second conventional method.
Figure 2:
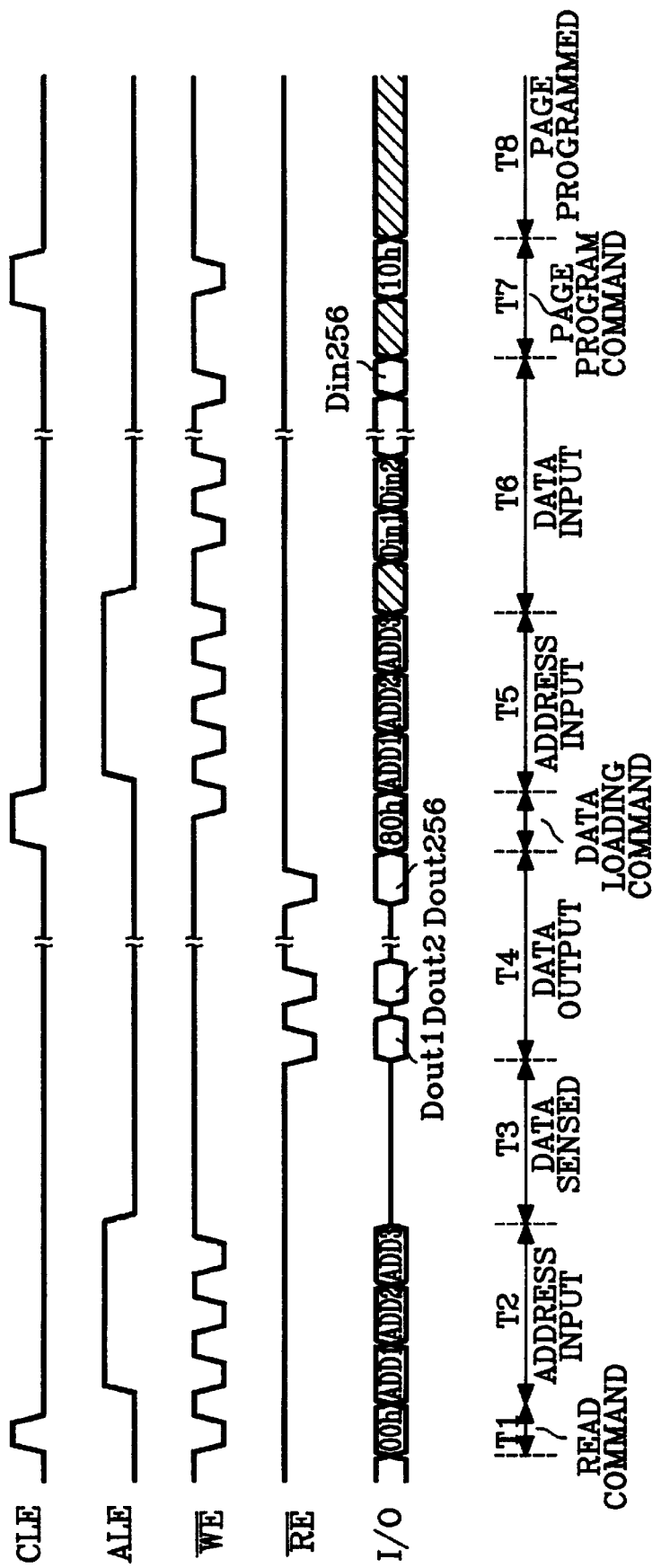
FIG. 2 illustrates the timing of control signals used to perform the operations illustrated by FIG. 1.
Figure 4:
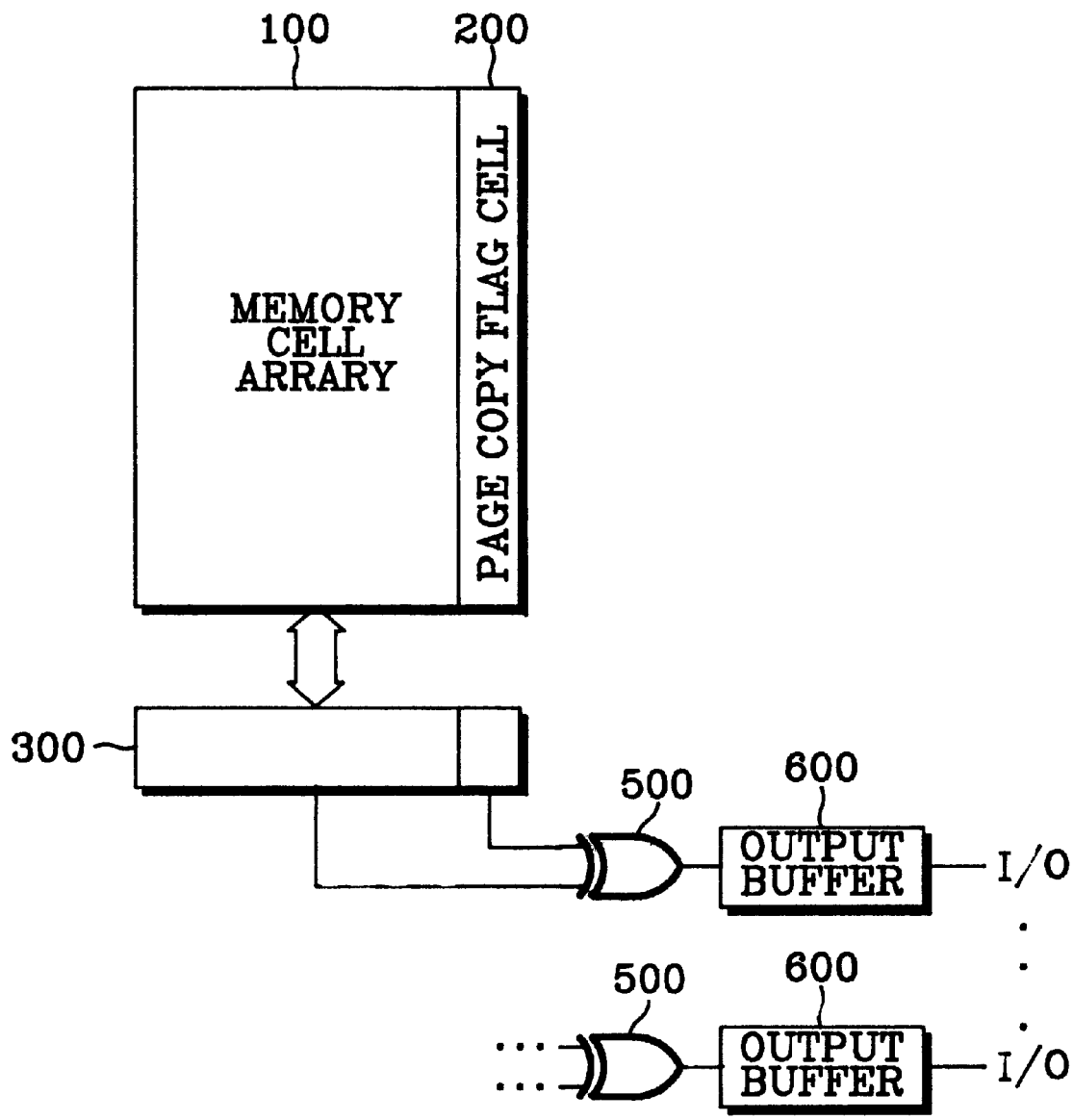
FIG. 4 illustrates a block diagram of an integrated circuit memory device according to one embodiment of the present invention.

Referring now to FIG. 4, a preferred integrated circuit memory device comprises a two-dimensional array of memory cells 100 arranged as a plurality of pages of memory cells electrically coupled to a respective plurality of word lines and a plurality of columns of memory cells electrically coupled to a respective plurality of bit lines. Such an array of memory cells 100 may include an array of NAND strings of EEPROM cells, as more fully described in commonly assigned U.S. Pat. No. 5,546,341 to Suh et al. entitled Nonvolatile Semiconductor Memory, the disclosure of which is hereby incorporated herein by reference. In addition to the array of memory cells 100, a plurality of flag cells 200 are also provided to retain flags (e.g., logic 1 values) to indicate whether respective pages of memory cells contain data copied in an inverted format from other pages of memory cells. The plurality of flag cells 200 may be arranged as a linear array of EEPROM cells so that each page of memory cells and its respective flag cell, share a respective word line.

Figure 5:
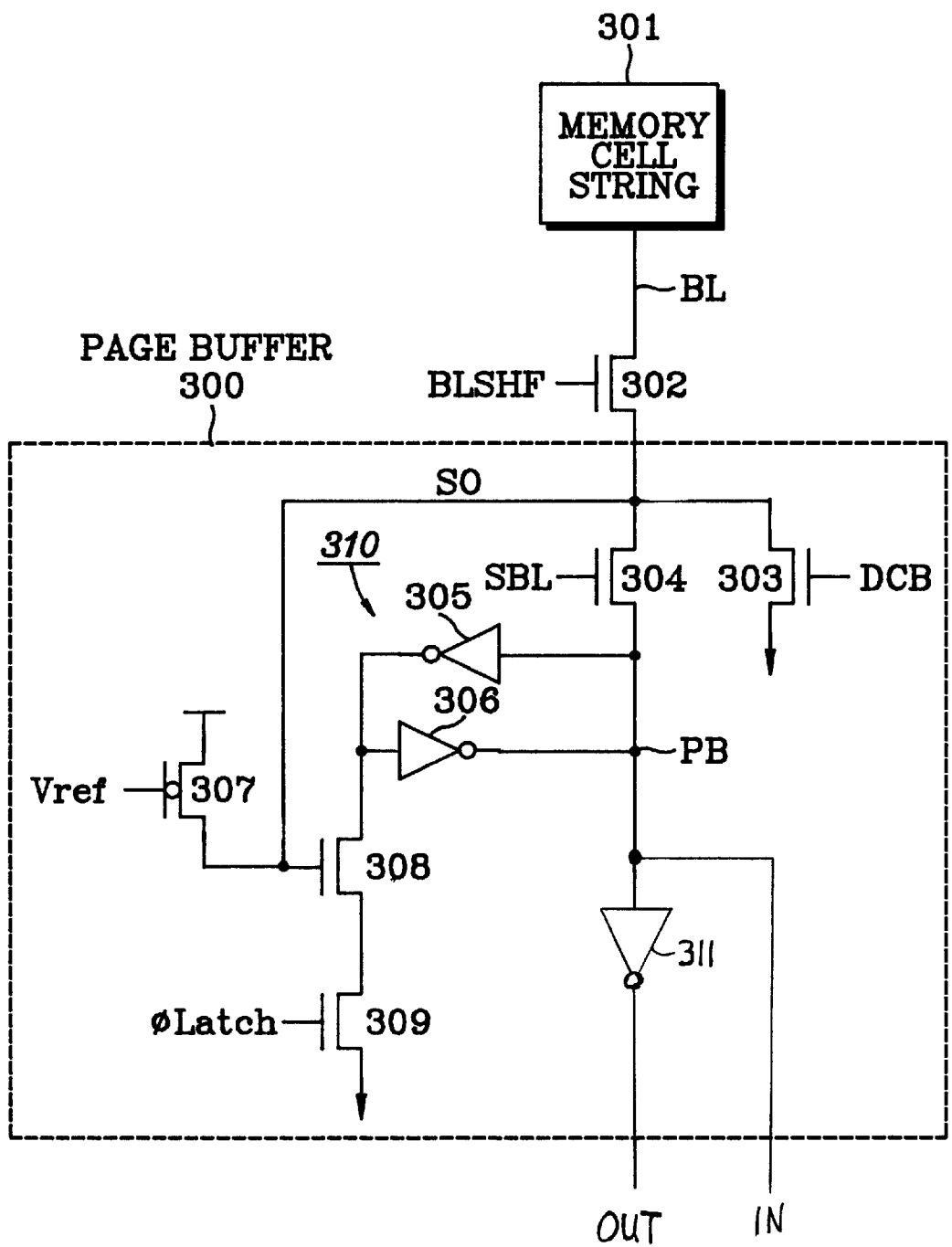
FIG. 5 illustrates an electrical schematic of an exemplary page buffer from the memory device of FIG. 4.

The preferred memory device also comprises a page buffer 300 to retain data read from a page of memory cells and a respective flag cell. Here, the page buffer 300 may also comprise a column selection circuit so that the retained data from the page of memory cells can be outputted in serial format to a data inverter 500 such as a two-input exclusive OR (XOR) gate. The output of the data inverter 500 is then forwarded to an output buffer 600 and then ultimately to an input/output (I/O) terminal. An exemplary page buffer 500 is illustrated by FIG. 5 which is described more fully hereinbelow, however other latch and latch-free page buffers may also be used including those disclosed in U.S. Pat. No. 5,761,132, commonly assigned to the present assignee, the disclosure of which is hereby incorporated herein by reference. Referring still to FIG. 4, the output of the data inverter 500 is a function of the page data serially input at a first input and the value (i.e., logic 1 or 0) of the flag data which is input and held at a second input of the data inverter 500 while the page data is being serially output from the page buffer 300. For example, if the value of the flag data is a logic 1 value, which indicates that the flag has been set and the retained page data is an inverted copy of data from another page, the output of the data inverter 500 will represent an inverted version of the serial page data provided by the page buffer 300 and thus a "true" copy of the data copied from the original page. These operations are described more fully hereinbelow with respect to FIGS. 10–11.

Referring now to FIG. 5, an exemplary single-bit page buffer 300 is illustrated as being coupled in series through a bit line isolation transistor 302 (e.g., NMOS) to a bit line BL of a respective string of memory cells 301, such as a NAND string of EEPROM cells in the memory cell array 100. As will be understood by those skilled in the art, such single bit page buffers 300 are replicated for each respective string of memory cells in the array 100 to form a multibit page buffer. As illustrated, the page buffer 300 comprises an NMOS isolation transistor 304, an NMOS sense node discharge transistor 303, a PMOS bit line precharge transistor 307 which is tied to a logic 1 reference potential (e.g., Vcc), a data latch 310 comprising antiparallel-connected inverters (305, 306), an output inverter 311, an NMOS sense transistor 308 and an NMOS latch transistor 309.

Figure 6:
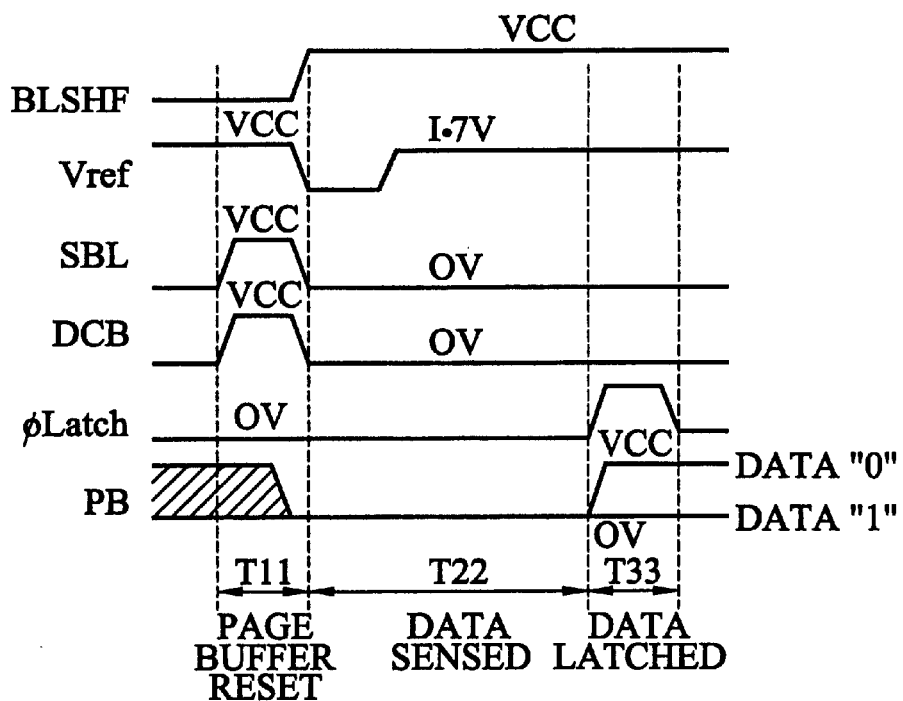
FIG. 6 illustrates the timing of control signals used by the page buffer of FIG. 5 to perform a page read operation, according to the present invention.

Referring now to FIG. 6, a method of reading data from a predetermined memory cell in a selected string 301 into a page buffer 300 will now be described. As illustrated during time interval T11, the sense node SO and latch output node PB are reset to a logic 0 potential (e.g., GND) by simultaneously turning on the NMOS isolation transistor 304 and the NMOS sense node discharge transistor 303 by applying a logic 1 potential to signal lines DCB and SBL. Then, during time interval T22, the isolation transistor and sense node discharge transistor 304 and 303 are turned-off to isolate the latch output node PB and allow the sense node and bit line BL to be precharged to a logic 1 potential. The sense node SO and bit line BL are precharged by turning on the PMOS bit line precharge transistor 307 and turning on the bit line isolation transistor 302. These transistors are turned on by switching signal line Vref from 1→0 (e.g., 2 Volts→GND) and switching signal line BLSHF from 0→1 at the commencement of time interval T22. Once the bit line BL has been precharged to a logic 1 potential during time interval T22, Vref is switched back to a logic 1 potential (e.g., 1.7 Volts) to almost completely turn off the bit line precharge transistor 307 and allow the data in the selected memory cell of the selected string 301 to be sensed.

As will be understood by those skilled in the art, if the selected memory cell is an EEPROM cell which has been programmed to retain a logic 0 value, the high level of the threshold voltage of the selected memory cell will prevent the bit line BL from being discharged during a data sense operation. Thus, if the selected memory cell has been programmed, the sense node SO will remain at a logic 1 potential and hold the sense transistor 308 in the "on" state. The data on the sense node SO can then be latched during time interval T33 by switching φLatch from 0→1 to turn on the NMOS latch transistor 309. When this occurs, the input to the latch 310 will be pulled to a logic 0 potential and the latch output node PB will be clamped at a logic 1 potential. Thus, if the selected memory cell is programmed to retain a logic 0 value, the latch output node PB will be held at an inverted logic 1 value. However, if the selected memory cell is not programmed, the bit line BL will conduct current and the sense node SO will drop to a logic 0 potential to turn off the sense transistor 308 and hold the latch output at an inverted logic 0 value.

Accordingly, a reading operation causes the latch 310 to retain an inverted version of the data in the selected memory cell at the latch output node PB. If a page copy operation is performed by loading this and other inverted bits of the original page data back (from the latch output node PB) into new memory cells at a new page, an inverted copy of the original page data will become stored at the new page.

Figure 7:
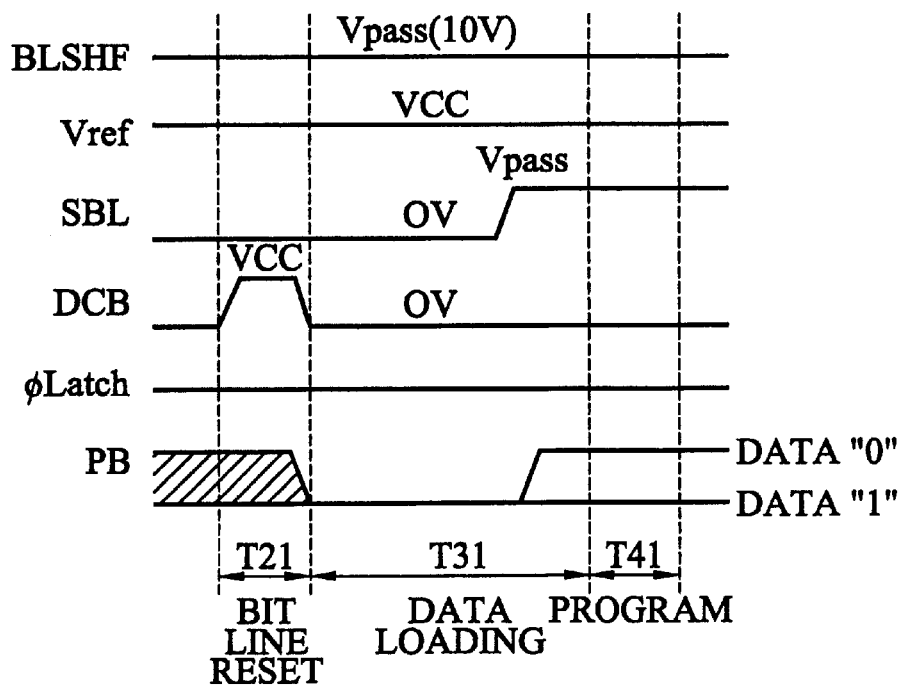
FIG. 7 illustrates the timing of control signals used by the page buffer of FIG. 5 to program a page of memory, according to the present invention.

These operations for loading an inverted copy of a page of memory cells from the page buffer 300 back into a page of memory at a different address are more fully illustrated by FIG. 7. For example, during the time interval T21, the bit line BL is reset to logic 0 by turning on the sense node discharge transistor 303 (by switching DCB from 0→1) and turning or holding the bit line isolation transistor 302 on. Then, during time interval T31, the inverted data retained at the latch output node PB of the buffer latch 310 is passed back to the bit line BL by turning on the isolation transistor (by switching SBL from 0→1). Then, during time interval T41, the inverted copy of the original page data is programmed into a new page of memory.

Figure 8:
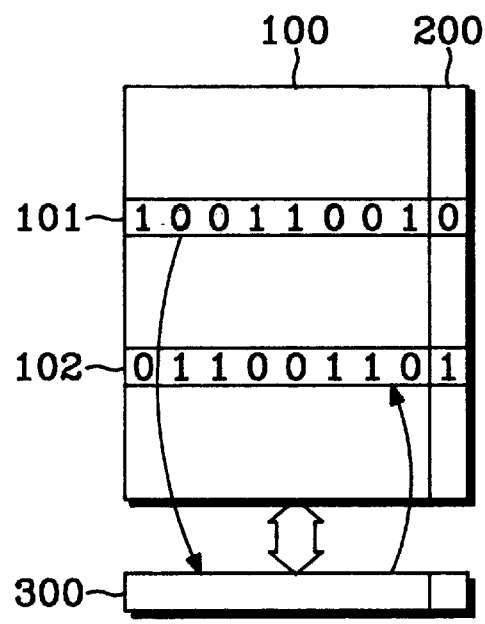
FIG. 8 illustrates operations for copying a first page of memory to a second page of memory, according to the present invention.
Figure 9:
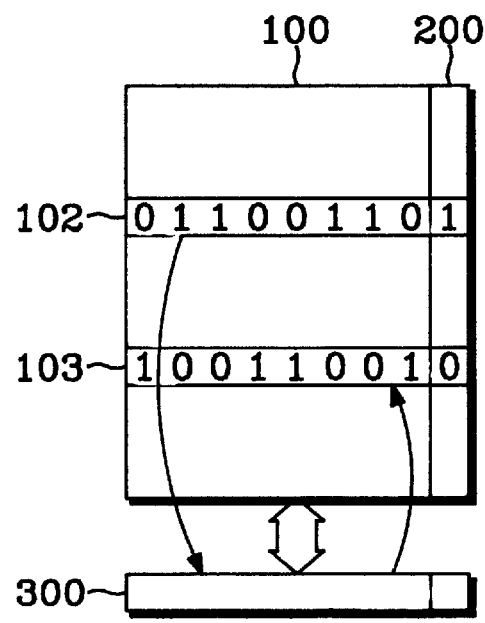
FIG. 9 illustrates operations for copying the second page of memory illustrated in FIG. 8 to a third page of memory, according to the present invention.

The operations described above with respect to FIGS. 6–7 are also illustrated by FIGS. 8–9. For example, FIG. 8 illustrates the steps of reading data from a first page of memory 101 (in a memory cell array 100) into a page buffer 300 and then copying the read data in inverted format back into a second page of memory 102 and setting/toggling a respective flag bit (in a plurality of flag cells 200) to a logic 1 value to indicate that the data in the second page of memory 102 is an inverted copy of data from another page of memory (i.e., first page 101). Similarly, FIG. 9 illustrates the steps of reading data from the second page of memory 102 into the page buffer 300 and then copying the read data in inverted format back into a third page of memory 103 and toggling the flag bit from 1–0 to indicate that the data in the third page is now a true copy of data from another page (e.g., the first page 101) of memory.

Figure 10:
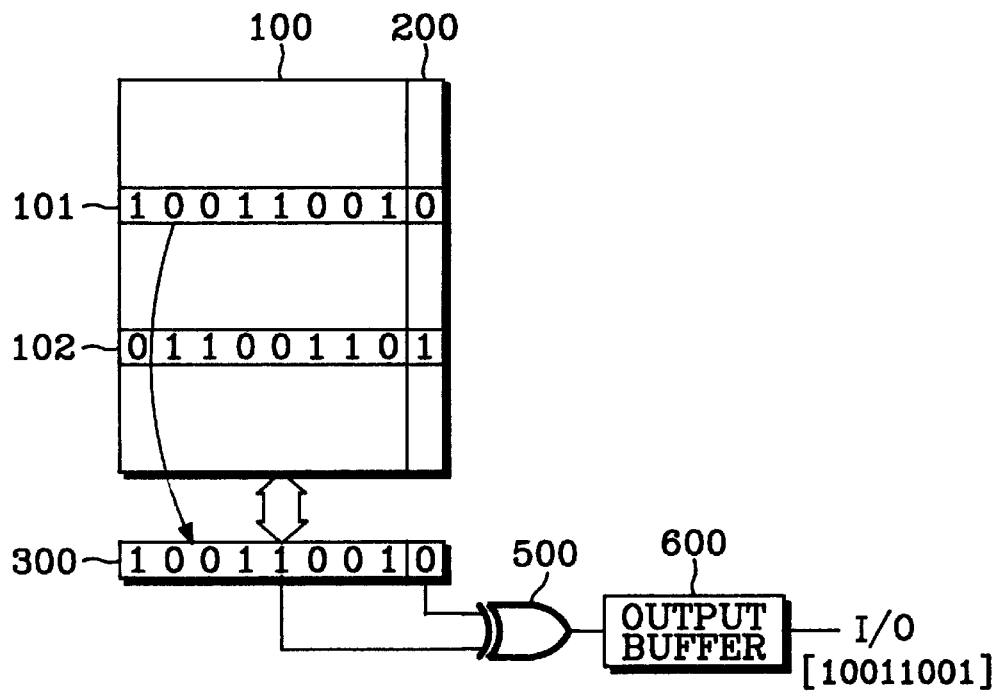
FIG. 10 illustrates operations for downloading the first page of memory illustrated in FIG. 8 to an input/output terminal, according to the present invention.
Figure 11:
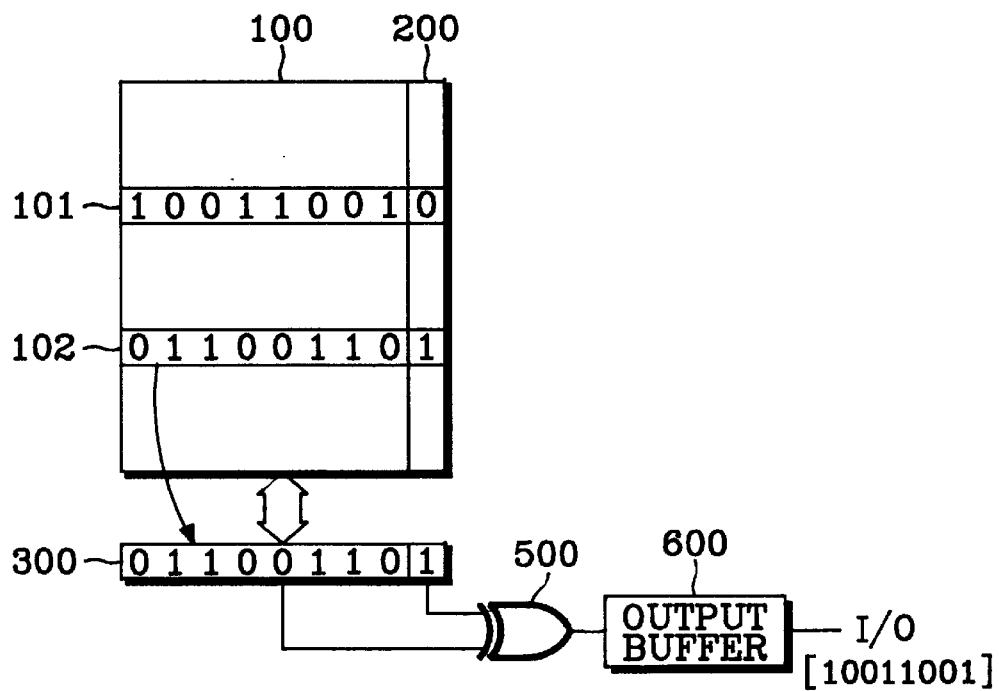
FIG. 11 illustrates operations for downloading the second page of memory illustrated in FIG. 8 to an input/output terminal, according to the present invention.

Referring now to FIGS. 10–11, the operations for downloading pages of data to an input/output (I/O) terminal will now be described. In FIG. 10, the data from the first page of memory 101 is downloaded into the page buffer 300 along with the corresponding flag bit. The data in the page buffer 300 is then serially output to the data inverter 500. The data inverter 500 checks the flag bit and inverts the serial data if the flag bit is a logic 1 value but not if the flag bit is a logic 0 value. The illustrated data inverter 500 is a two-input exclusive OR (XOR) gate having an output coupled to an output buffer 600. Alternatively, in FIG. 11, the data from the second page of memory 102 is downloaded into the page buffer 300 along with the corresponding flag bit. The data in the page buffer 300 (i.e., 01100110) is then serially output to the data inverter 500 which checks the flag bit and inverts the serial data because the flag bit is a logic 1 value. Thus, the data outputted by the page buffer 600 is a true copy of the first page of memory (i.e., 10011001) from which the second page of memory was copied.

Figure 12:
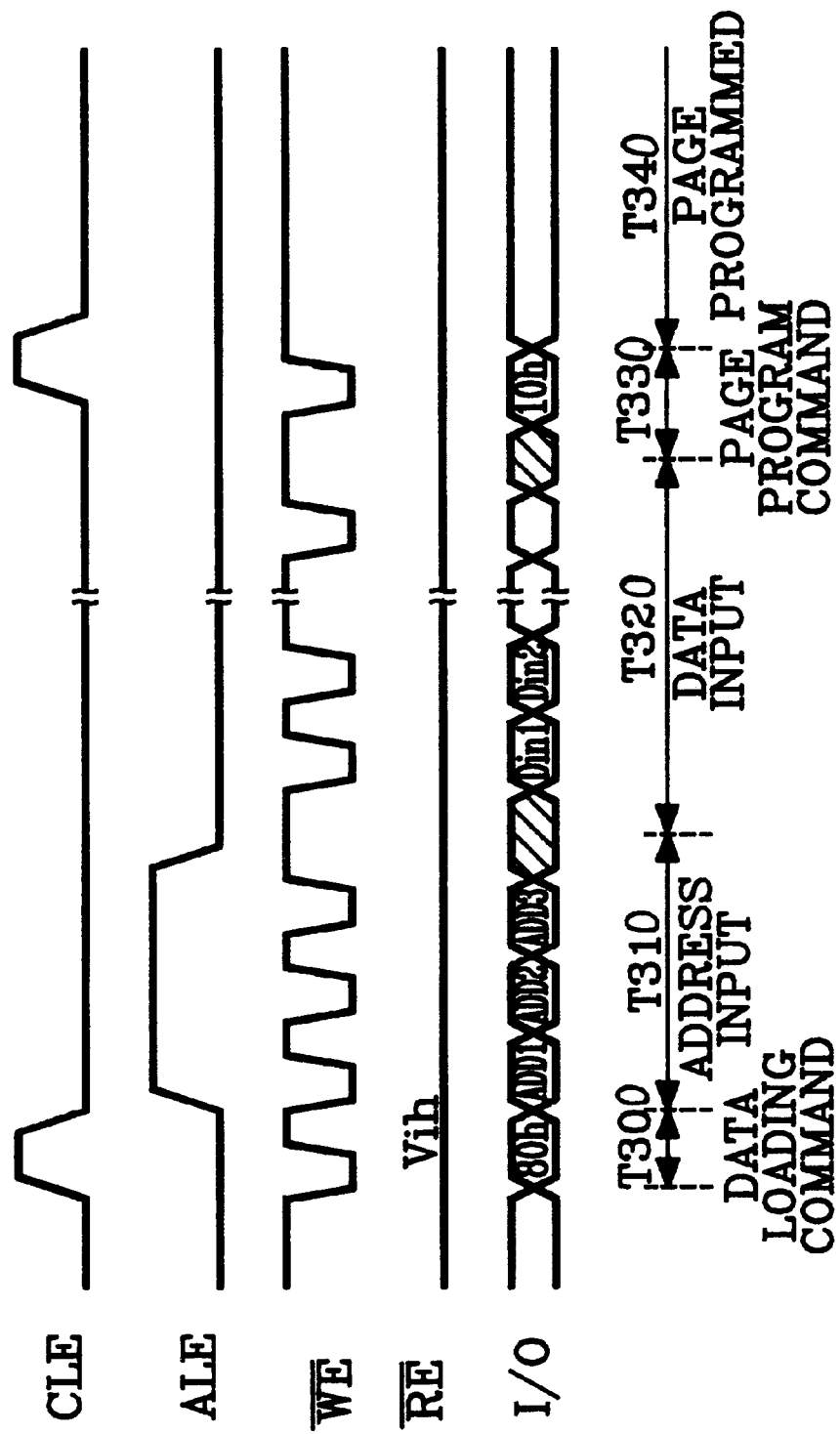
FIG. 12 illustrates the timing of control signals used by the memory device of FIG. 4 to program a page of memory.

Referring now to FIG. 12, operations for programming memory with data serially recieved from an input/output (I/O) terminal will now be described. In particular, as illustrated by FIG. 12, the timing pulses inputted to perform a normal page programming operation are a command latch enable signal CLE, an address latch enable signal ALE, a write enable signal $\overline{WE}$, and a read enable signal $\overline{RE}$. When a data loading command "80h" is applied via the I/O terminal during interval T300, and addresses of three cycles are applied during interval T310, then 256 bytes of data, for example, are sequentially inputted to the page buffer 300 during interval T320. Finally, a page programming command "10h" is inputted during interval T330, and then the page programming operation is accomplished during interval T340. This is achieved by toggling the write enable signal $\overline{WE}$ with the command latch enable signal CLE at a logic 1 state, to cause the input data to be recognized by the memory as loading command.

In addition, the memory recognizes the address of the data inputted through the I/O terminal in the interval during which the address latch enable signal ALE is "high". The data inputted through the I/O terminal (by toggling the write enable signal $\overline{WE}$) is identified as the input data for programming when the command latch enable and address latch enable signals ALE and CLE are all "low". Further, if the command latch enable and address latch enable signals CLE and ALE are all "low", and the read enable signal $\overline{RE}$ also "low", the data is internally inputted through the I/O terminal. For example, if one page contains 256 bytes, and if the data loading command "80h" is inputted and then the addresses of three cycles are applied, the 256 bytes of data are sequentially inputted. Finally, upon receipt of the page programming command "10", all the memory cells of a selected page are programmed. In this case, the flag cell attached to the selected page is programmed with "0" to indicate that the data is not in an inverted format.

Figure 13:
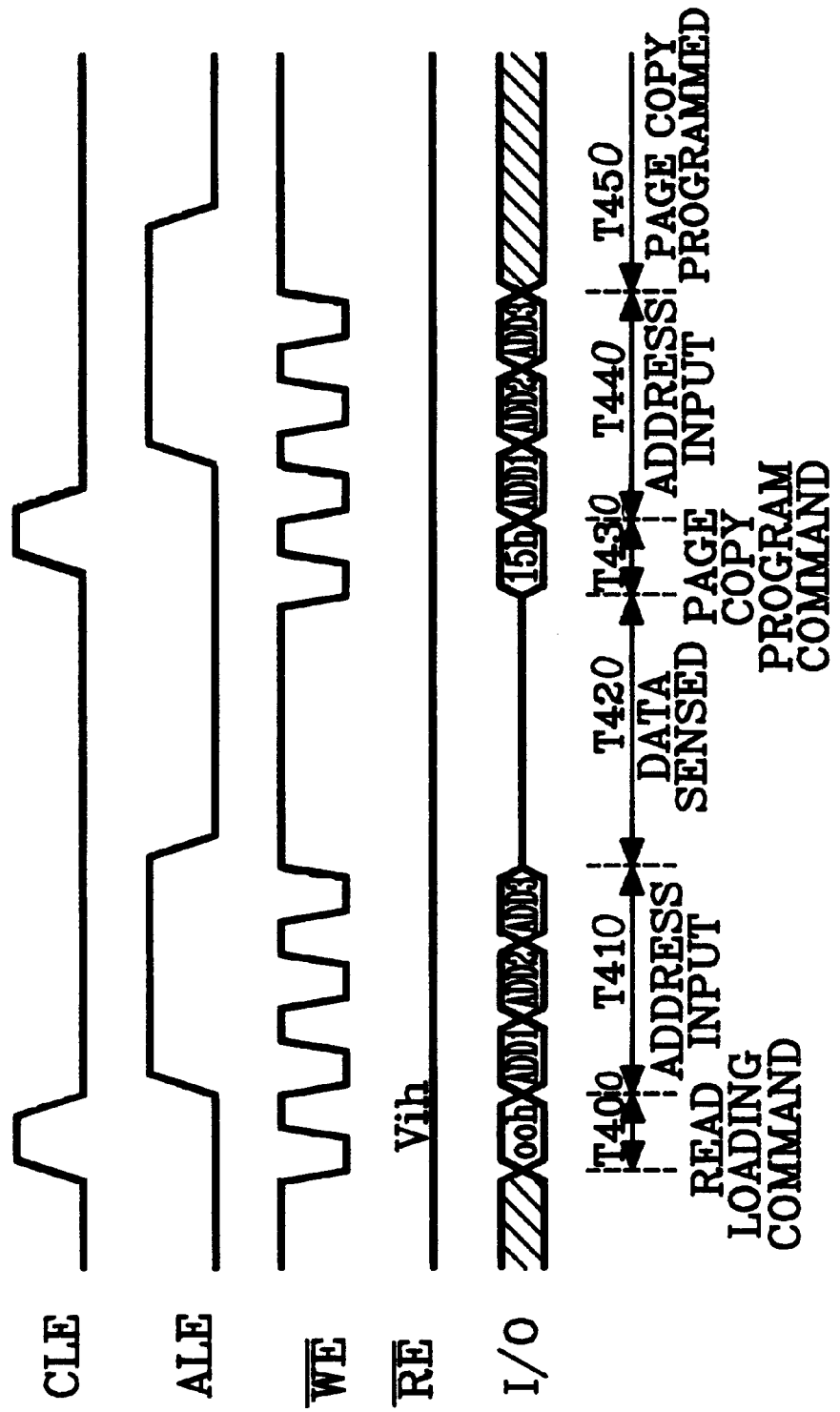
FIG. 13 illustrates the timing of control signals used by the memory device of FIG. 4 to copy a page of memory.

The operations for performing a page copy will now be described with respect to FIG. 13. Here, the command latch enable signal CLE, the address latch enable signal ALE, the write enable signal $\overline{WE}$, and the read enable signal $\overline{RE}$ are provided as control signals. If the read command "00h" is applied during interval T400, and the addresses of three cycles are applied during interval T410, the data in a page of memory is sensed during interval T420 and temporarily stored in the page buffer. The addresses of three cycles for identifying the address of the target page are applied after applying the page copy programming command "15h" in interval T430. The data stored in the page buffer is then programmed directly into the memory cells of the target page without being externally outputted. Here, the flag cell attached to the target page is programmed with a flag (i.e., logic 1). Then, when reading the data in the copied page, the value of the flag cell attached to the page causes the data inverter 500 to invert the logical state of the copied data to the logical state of the data so as to finally produce the original data as a serial string to the output buffer 600.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   an array of memory cells arranged as a plurality of pages of memory cells electrically coupled to a respective plurality of word lines and a plurality of columns of memory cells electrically coupled to a respective plurality of bit lines;
   a plurality of flag cells, each of said plurality of flag cells coupled to a respective one of the plurality of pages of memory cells by a respective word line and retaining a flag which indicates whether the respective one of the plurality of pages of memory cells contains data copied in an inverted format from another one of the plurality of pages of memory cells;
   a page buffer, coupled to said array of memory cells and said plurality of flag cells, to retain data read from a page of memory cells and a respective flag cell; and
   a data inverter, coupled to an output of said page buffer, to output an inverted copy of the read data if the respective flag cell contains a flag and pass the read data unchanged if the respective flag cell does not contain a flag;
   wherein each of the plurality of pages of memory cells shares a word line with a respective flag cell in said plurality of flag cells.

2. The integrated circuit memory device of claim 1, wherein said array of memory cells and said plurality of flag cells comprise EEPROM cells.

3. The integrated circuit memory device of claim 1, wherein said data inverter comprises an exclusive OR gate.

* * * * *